(12) United States Patent
Li

(10) Patent No.: US 8,045,674 B2
(45) Date of Patent: Oct. 25, 2011

(54) METHOD AND SYSTEM FOR USE OF TSPC LOGIC FOR HIGH-SPEED MULTI-MODULUS DIVIDER IN PLL

(75) Inventor: Dandan Li, San Diego, CA (US)

(73) Assignee: Broadcom Corporation, Irvine, CA (US)

( * ) Notice: Subject to any disclaimer, the term of this patent is extended or adjusted under 35 U.S.C. 154(b) by 985 days.

(21) Appl. No.: 11/618,718

(22) Filed: Dec. 29, 2006

(65) Prior Publication Data

US 2008/0136540 A1 Jun. 12, 2008

Related U.S. Application Data

(60) Provisional application No. 60/868,818, filed on Dec. 6, 2006.

(51) Int. Cl.
*H03K 21/00* (2006.01)

(52) U.S. Cl. ............ 377/47; 377/48; 327/115; 327/117; 327/156

(58) Field of Classification Search .................. 331/1 A, 331/34, 25; 327/115, 117, 118, 156, 157, 327/159; 377/47, 48
See application file for complete search history.

(56) References Cited

U.S. PATENT DOCUMENTS

| | | | | |
|---|---|---|---|---|
| 5,038,117 A | * | 8/1991 | Miller | 331/16 |
| 5,930,322 A | * | 7/1999 | Yang et al. | 377/48 |
| 6,566,918 B1 | * | 5/2003 | Nguyen | 327/115 |
| 7,242,231 B2 | * | 7/2007 | Kuo et al. | 327/156 |
| 7,538,590 B2 | * | 5/2009 | Lin | 327/115 |
| 2003/0184347 A1 | * | 10/2003 | Haroun et al. | 327/99 |
| 2004/0196940 A1 | * | 10/2004 | Chien | 375/376 |
| 2005/0212570 A1 | * | 9/2005 | Sun et al. | 327/115 |

OTHER PUBLICATIONS

Li, et al., "A 7 GHz 1.5-V Dual-Modulus Prescalar in 0.18 um Copper-CMOS Technology", Jul. 2002, Springer Netherlands, Analog Integrated Circuits and Signal Processing, vol. 32, No. 1, pp. 89-95.*

Kim, et al., "A fractional-n PLL frequency synthesizer design", Apr. 8-10, 2005, SoutheastCon, 2005. Proceedings. IEEE, pp. 84-87.*

(Continued)

*Primary Examiner* — Ryan Johnson

(74) *Attorney, Agent, or Firm* — McAndrews, Held & Malloy, Ltd.

(57) ABSTRACT

Aspects of a method and system for use of true single phase clock (TSPC) logic for a high-speed multi-modulus divider in a phase locked loop (PLL) are provided. A fractional-N PLL synthesizer may comprise a divider that generates a divider signal from a VCO output reference signal. The divider may comprise at least one divider stage that utilizes true single phase clock (TSCP) logic D flip-flops. The first divider stage may operate at substantially the same frequency as that of the VCO signal. The divider may also re-synchronize the VCO signal and the divider signal by using at least two re-synchronization stages that utilize a TSCP logic D flip-flop and a stage for adjusting duty-duty cycle of the divider signal. The TSCP logic D flip-flops circuitry may be integrated with a two-input NAND gate or a three-input NAND gate to speed up the operation of the divider.

18 Claims, 12 Drawing Sheets

OTHER PUBLICATIONS

Q. Huang and R. Rogenmoser, "Speed Optimization of Edge-Triggered CMOS CircuitsFor Gigahertz Single-Phase Clock," IEEE JSSC, vol. 31, No. 3, pp. 456-464, Mar. 1996.

H. Huh, Y. Koo, K. Lee, Y. Ok, S. Lee D. Kwon, J. Lee, Joonbae Park, D. Lee, D. Jeong and W. Kim, "Comparison Frequency Doubling and Charge Pump Matching Techniques for Dual-Band Fractional-N Frequency Synthesizer," IEEE JSSC, vol. 40, No. 11, pp. 2228-2236, Nov. 2005.

M. Kozak and E. Friedman, "Design and Simulation of Fractional-N PLL Frequency Synethesizers," IEEE ISCAS 2004, pp. 780-783, May 2004.

S. Pellerano, S. Levantino, C. Samori, and L. Lacaita, "A 13.5-mW 5 GHz Frequency Synthesizer With Dynamic-Logic Frequency Divider," IEEE JSSC, vol. 39, No. 2, pp. 378-383, Feb. 2004.

J. Yuan and C. Svensson, "High-Speed CMOS Circuit Technique," IEEE JSSC. vol. 24, No. 1, pp. 62-70, Feb. 1989.

* cited by examiner

_US 8,045,674 B2_

METHOD AND SYSTEM FOR USE OF TSPC LOGIC FOR HIGH-SPEED MULTI-MODULUS DIVIDER IN PLL

CROSS-REFERENCE TO RELATED APPLICATIONS/INCORPORATION BY REFERENCE

This patent application makes reference to, claims priority to and claims benefit from U.S. Provisional Patent Application Ser. No. 60/868,818 filed on Dec. 6, 2006.

This application also makes reference
U.S. application Ser. No. 11/618,655 filed on Dec. 29, 2006;
U.S. application Ser. No. 11/618,651 filed on Dec. 29, 2006; and
U.S. application Ser. No. 11/618,715 filed on Dec. 29, 2006.

Each of the above stated applications is hereby incorporated by reference in its entirety.

FIELD OF THE INVENTION

Certain embodiments of the invention relate to systems for processing RF signals. More specifically, certain embodiments of the invention relate to a method and system for use of true single phase clock (TSPC) logic for a high-speed multi-modulus divider in a phase locked loop (PLL).

BACKGROUND OF THE INVENTION

Wireless Local Area Networks (WLANs) have gained significant popularity and are widely deployed because of the flexibility and convenience in connectivity that they provide. WLANs enable connections to devices that are located within somewhat large geographical areas, such as the area covered by a building or a campus, for example. WLAN systems are based on IEEE 802.11 standard specifications, which typically operate within a 100-meter range, and are generally utilized to supplement the communication capacity provided by traditional wired Local Area Networks (LANs) installed in the same geographic area as the WLAN systems.

The introduction of networks based on the new IEEE 802.11n standard specifications promises to at least double the theoretical wireless bandwidth of today's 54 Mbit/s data rates supported by IEEE 802.11a/g networks, for example. In fact, networks based on the proposed IEEE 802.11n specifications may be able to offer up to 10 times the capacity offered by current WLAN systems.

Because of the increases in data rates supported by forthcoming WLAN systems, more demanding specifications may be required for the design of frequency synthesizers used in wireless terminals, such as mobile devices, for example, and/or in access points (APs) to generate the reference signals used for IEEE 802.11n operation. WLAN radios may also be integrated into a cellular phone. For such embedded application, a frequency synthesizer may need to be able to operate over a wide range of reference frequencies. At the same time, loop bandwidth may have to be sufficiently high to meet settling requirements when a WLAN radio is switched between receiving and transmitting operations.

Optimizing the design of a frequency synthesizer requires that both high bandwidth and low phase noise specifications are met simultaneously, a task that may generally be difficult to achieve. In this regard, fractional-N phase-locked-loop (PLL) frequency synthesizers may be utilized in wireless terminals to try to meet simultaneous fine resolution and high bandwidth. The fractional-N PLL frequency synthesizer enables dithering a divide value between integer values in order to produce a fractional divide value that is utilized in the frequency synthesizer's feedback loop. However, the dithering operation may generally introduce quantization noise into the frequency synthesizer, negatively impacting the overall phase noise performance. Moreover, as the bandwidth in the loop increases more quantization noise appears at the output. However, a higher bandwidth may better suppress the noise contributed by a voltage controlled oscillator (VCO). When trying to achieve a given noise specification, different noise sources inside the PLL may result in conflicting requirements on loop bandwidth. In this regard, performance optimization becomes an important aspect of the frequency synthesizer design. Furthermore, higher data rates may also require increased power usage, which may be limited and thus undesirable in wireless devices.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method is provided for use of true single phase clock (TSPC) logic for a high-speed multi-modulus divider in a phase locked loop (PLL), substantially as shown in and/or described in connection with at least one of the figures, as set forth more completely in the claims.

These and other advantages, aspects and novel features of the present invention, as well as details of an illustrated embodiment thereof, will be more fully understood from the following description and drawings.

DETAILED DESCRIPTION OF THE INVENTION

Certain embodiments of the invention may be found in a method and system for use of true single phase clock (TSPC) logic for high-speed multi-modulus divider in phase locked loop (PLL). Aspects of the invention may comprise a fractional-N PLL synthesizer that may utilize a divider for generating a divider signal from a VCO output reference signal. The divider may comprise at least one divider stage that utilizes true single phase clock (TSCP) logic D flip-flops. The first divider stage may operate at substantially the same frequency as that of the VCO signal. The divider may also re-synchronize the VCO signal and the divider signal by using at least two re-synchronization stages that utilize a TSCP logic D flip-flop and a stage for adjusting duty-duty cycle of the divider signal. The TSCP logic D flip-flops circuitry may be integrated with a two-input NAND gate or a three-input NAND gate to speed up the operation of the divider.

Figure 1A:
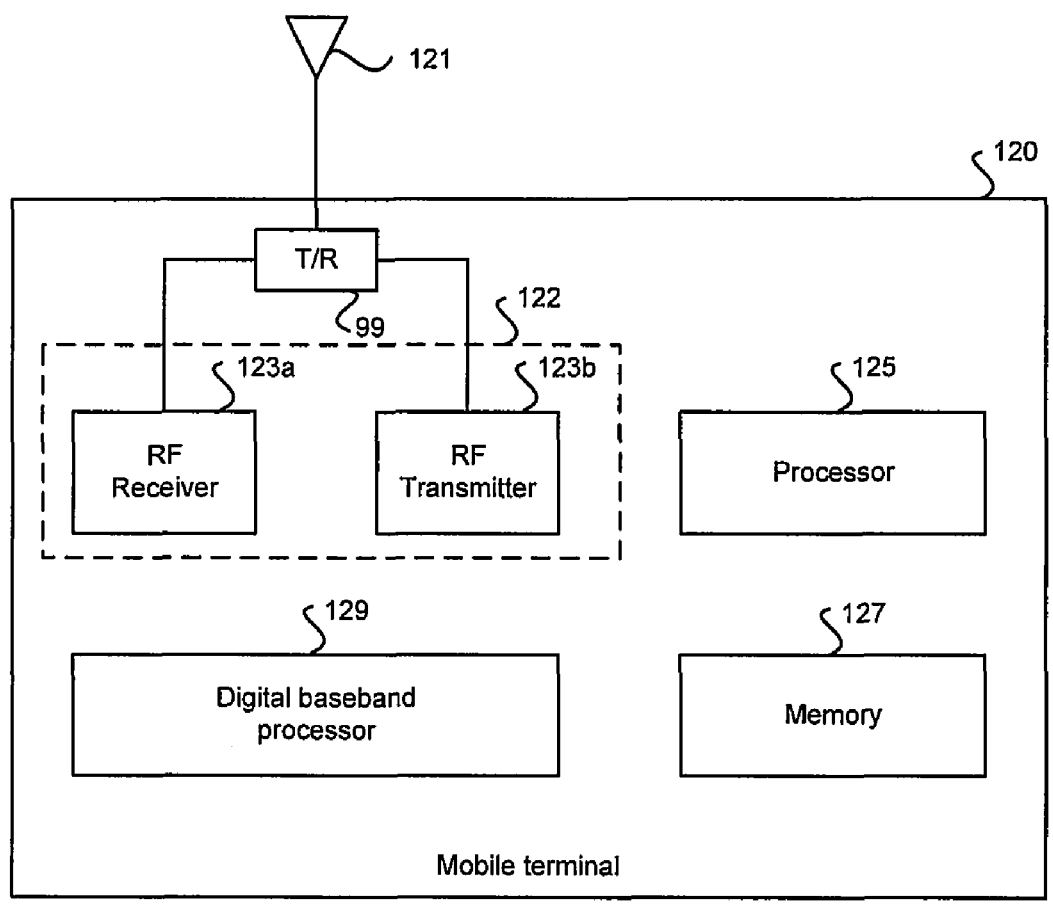
FIG. 1A is a block diagram illustrating an exemplary wireless terminal, in accordance with an embodiment of the invention.

FIG. 1A is a block diagram illustrating an exemplary wireless terminal, in accordance with an embodiment of the invention. Referring to FIG. 1A, there is shown a wireless terminal 120 that may comprise an RF receiver 123a, an RF transmitter 123b, a digital baseband processor 129, a processor 125, and a memory 127. A single transmit and receive antenna 121 may be communicatively coupled to the RF receiver 123a and the RF transmitter 123b. A switch or other device having switching capabilities may be coupled between the RF receiver 123a and RF transmitter 123b, and may be utilized to switch the antenna between transmit and receive functions. The wireless terminal 120 may be operated in a system, such as the Wireless Local Area Network (WLAN), a cellular network and/or digital video broadcast network, for example. In this regard, the wireless terminal 120 may support a plurality of wireless communication protocols, including the IEEE 802.11n standard specifications for WLAN networks.

The RF receiver 123a may comprise suitable logic, circuitry, and/or code that may enable processing of received RF signals. The RF receiver 123a may enable receiving RF signals in a plurality of frequency bands in accordance with the wireless communications protocols that may be supported by the wireless terminal 120. Each frequency band supported by the RF receiver 123a may have a corresponding front-end circuit for handling low noise amplification and down conversion operations, for example. In this regard, the RF receiver 123a may be referred to as a multi-band receiver when it supports more than one frequency band. In another embodiment of the invention, the wireless terminal 120 may comprise more than one RF receiver 123a, wherein each of the RF receiver 123a may be a single-band or a multi-band receiver. The RF receiver 123a may be implemented on a chip. In an embodiment of the invention, the RF receiver 123a may be integrated with the RF transmitter 123b on a chip to comprise an RF transceiver, for example. In another embodiment of the invention, the RF receiver 123a may be integrated on a chip with more than one component in the wireless terminal 120.

The RF receiver 123a may quadrature down convert the received RF signal to a baseband frequency signal that comprises an in-phase (I) component and a quadrature (Q) component. The RF receiver 123a may perform direct down conversion of the received RF signal to a baseband frequency signal, for example. In some instances, the RF receiver 123a may enable analog-to-digital conversion of the baseband signal components before transferring the components to the digital baseband processor 129. In other instances, the RF receiver 123a may transfer the baseband signal components in analog form.

The digital baseband processor 129 may comprise suitable logic, circuitry, and/or code that may enable processing and/or handling of baseband frequency signals. In this regard, the digital baseband processor 129 may process or handle signals received from the RF receiver 123a and/or signals to be transferred to the RF transmitter 123b, when the RF transmitter 123b is present, for transmission to the network. The digital baseband processor 129 may also provide control and/or feedback information to the RF receiver 123a and to the RF transmitter 123b based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the network. In an embodiment of the invention, the digital baseband processor 129 may be integrated on a chip with more than one component in the wireless terminal 120.

The RF transmitter 123b may comprise suitable logic, circuitry, and/or code that may enable processing of RF signals for transmission. The RF transmitter 123b may enable transmission of RF signals in a plurality of frequency bands. Each frequency band supported by the RF transmitter 123b may have a corresponding front-end circuit for handling amplification and up conversion operations, for example. In this regard, the RF transmitter 123b may be referred to as a multi-band transmitter when it supports more than one frequency band. In another embodiment of the invention, the wireless terminal 120 may comprise more than one RF transmitter 123b, wherein each of the RF transmitter 123b may be a single-band or a multi-band transmitter. The RF transmitter 123b may be implemented on a chip. In an embodiment of the invention, the RF transmitter 123b may be integrated with the RF receiver 123a on a chip to comprise an RF transceiver, for example. In another embodiment of the invention, the RF transmitter 123b may be integrated on a chip with more than one component in the wireless terminal 120.

The RF transmitter 123b may quadrature up convert the baseband frequency signal comprising I/Q components to an RF signal. The RF transmitter 123b may perform direct up conversion of the baseband frequency signal to a baseband frequency signal, for example. In some instances, the RF transmitter 123b may enable digital-to-analog conversion of the baseband signal components received from the digital baseband processor 129 before up conversion. In other instances, the RF transmitter 123b may receive baseband signal components in analog form.

The processor 125 may comprise suitable logic, circuitry, and/or code that may enable control and/or data processing operations for the wireless terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the wireless terminal 120. The processor 125 may also enable executing of applications that may be utilized by the wireless terminal 120. For example, the processor 125 may generate at least one control signal and/or may execute applications that may enable current and proposed WLAN communications in the wireless terminal 120.

The memory 127 may comprise suitable logic, circuitry, and/or code that may enable storage of data and/or other information utilized by the wireless terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the wireless terminal 120. For example, the memory 127 may comprise information necessary to configure the RF receiver 123a for receiving WLAN signals in the appropriate frequency band.

Figure 1B:
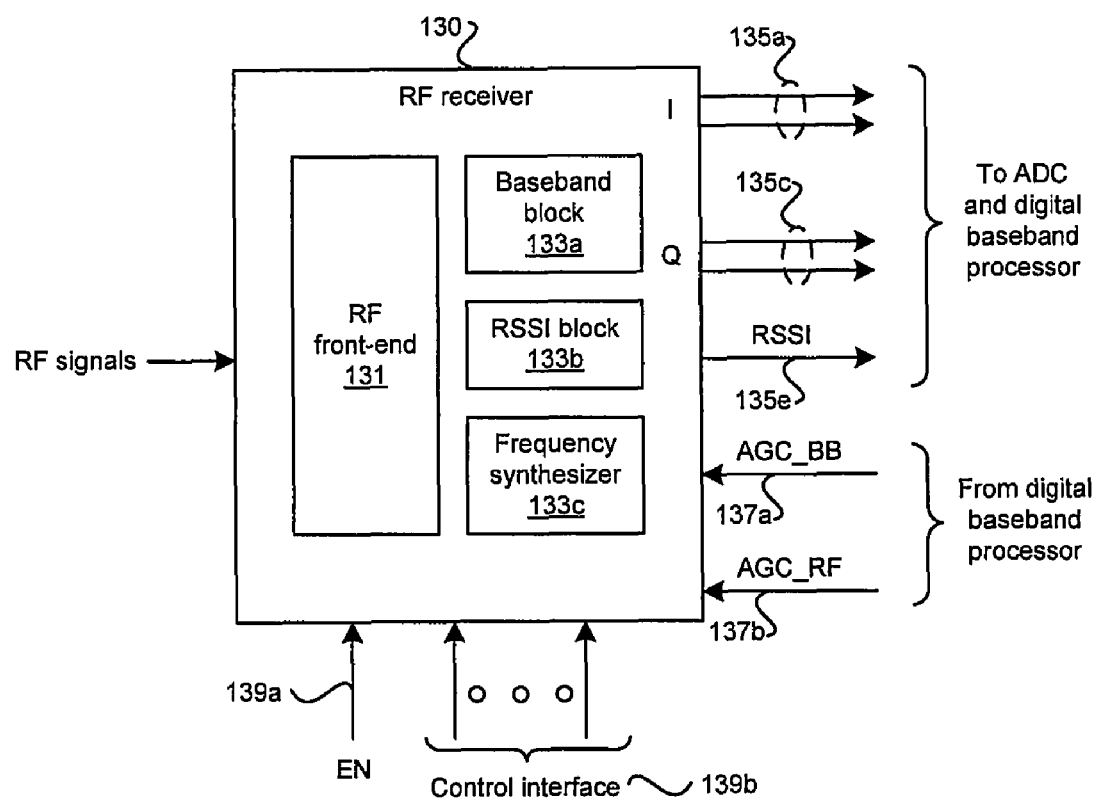
FIG. 1B is a block diagram illustrating an exemplary RF receiver in a mobile terminal, in accordance with an embodiment of the invention.

FIG. 1B is a block diagram illustrating an exemplary RF receiver in a mobile terminal, in accordance with an embodiment of the invention. Referring to FIG. 1B, there is shown an RF receiver 130 that may comprise an RF front-end 131, a baseband block 133a, a received signal strength indicator (RSSI) block 133b, and a frequency synthesizer 133c. The RF receiver 130 may correspond to the RF receiver 123a in the wireless terminal 120 disclosed in FIG. 1A, for example.

The RF receiver 130 may comprise suitable logic, circuitry, and/or code that may enable handling of a plurality of RF signals that may comprise signals in accordance with the IEEE 802.11 n standard specifications for WLAN networks. The RF receiver 130 may be enabled via an enable signal, such as the signal EN 139a, for example. At least a portion of the circuitry within the RF receiver 130 may be controlled via the control interface 139b. The control interface 139b may receive information from, for example, a processor, such as the processor 125 and/or the digital baseband processor 129 disclosed in FIG. 1A. The control interface 139b may comprise more than one bit. For example, when implemented as a 2-bit interface, the control interface 139b may be an inter-integrated circuit (I2C) interface.

The RF front-end 131 may comprise suitable logic, circuitry, and/or code that may enable low noise amplification and direct down conversion of RF signals. In this regard, the RF front-end 131 may utilize an integrated low noise amplifier (LNA) and mixers, such as passive mixers, for example. The RF front-end 131 may communicate the resulting baseband frequency signals to the baseband block 133a for further processing. In an embodiment of the invention, the RF front-end 131 may enable receiving RF signals in a plurality of frequency bands that may comprise the frequency band utilized for WLAN communications. In this regard, the RF front-end 131 may be implemented by utilizing separate RF front-end blocks for each of the frequency bands supported, for example.

The frequency synthesizer 133c may comprise suitable logic, circuitry, and/or code that may enable generating the appropriate local oscillator (LO) signal or reference signal for performing down conversion in the RF front-end 131. Since the frequency synthesizer 133c may enable fractional multiplication of a source frequency when generating the LO signal, a large range of crystal oscillators may be utilized as a frequency source for the frequency synthesizer 133c. This approach may enable the use of an existing crystal oscillator in a mobile terminal PCB, thus reducing the number of external components necessary to support the operations of the RF receiver 130, for example. In some instances, the frequency synthesizer 133c may have at least one integrated voltage controlled oscillator (VCO) for generating the LO signal. For example, the frequency synthesizer 133c may be implemented based on fractional-N phase-locked-loop (PLL) synthesizer design to enable high bandwidth and to achieve low phase noise specifications. In this regard, the design of the frequency synthesizer 133c may be required to support higher data rates, such as the data rates specified in the IEEE 802.11n standard for WLAN networks, for example.

The baseband block 133a may comprise suitable logic, circuitry, and/or code that may enable processing of I/Q components generated from the down conversion operations in the RF front-end 131. The baseband block 133a may enable amplification and/or filtering of the I/Q components in analog form. The baseband block 133a may also enable communication of the processed I component, that is, signal 135a, and of the processed Q component, that is, signal 135c, to an analog-to-digital converter (ADC) for digital conversion before being communicated to the digital baseband processor 129, for example.

The RSSI block 133b may comprise suitable logic, circuitry, and/or code that may enable measuring the strength, that is, the RSSI value, of a received RF signal. The RSSI block 133b may be implemented based on a logarithmic amplifier, for example. The RSSI measurement may be performed, for example, after the received RF signal is amplified in the RF front-end 131. The RSSI block 133b may enable communication of the analog RSSI measurement, that is, signal 135e, to an ADC for digital conversion before being communicated to the digital baseband processor 129, for example.

The RF receiver 130 may enable receiving at least one signal, such as the signals AGC_BB 137a and AGC_RF 137b, from the digital baseband processor 129 for adjusting operations of the RF receiver 130. For example, the signal AGC_BB 137a may be utilized to adjust the gain provided by the baseband block 133a on the baseband frequency signals generated from the RF front-end 131. In another example, the signal AGC_RF 137b may be utilized to adjust the gain provided by an integrated LNA in the RF front-end 131. In this regard, the signal AGC_RF 137b may be utilized to adjust the gain during a calibration mode, for example. In another example, the RF receiver 130 may enable receiving from the digital baseband processor 129 at least one control signal or control information via the control interface 139b for adjusting operations within the RF receiver 130.

Notwithstanding that the frequency synthesizer 133c has been shown as comprised within the RF receiver 130, aspects of the invention need not be so limited. In this regard, a frequency synthesizer integrated within an RF receiver may also be utilized with an RF transmitter, such as the RF transmitter 123b disclosed in FIG. 1A, for example. In some instances, a frequency synthesizer may be integrated within the RF transmitter and may be utilized by the RF receiver. In other instances, the frequency synthesizer may be implemented separate from the RF transmitter or the RF receiver, for example. Moreover, when a single RF transceiver is utilized with the wireless terminal 120, the frequency synthesizer may be integrated within the single RF transceiver.

Figure 1C:
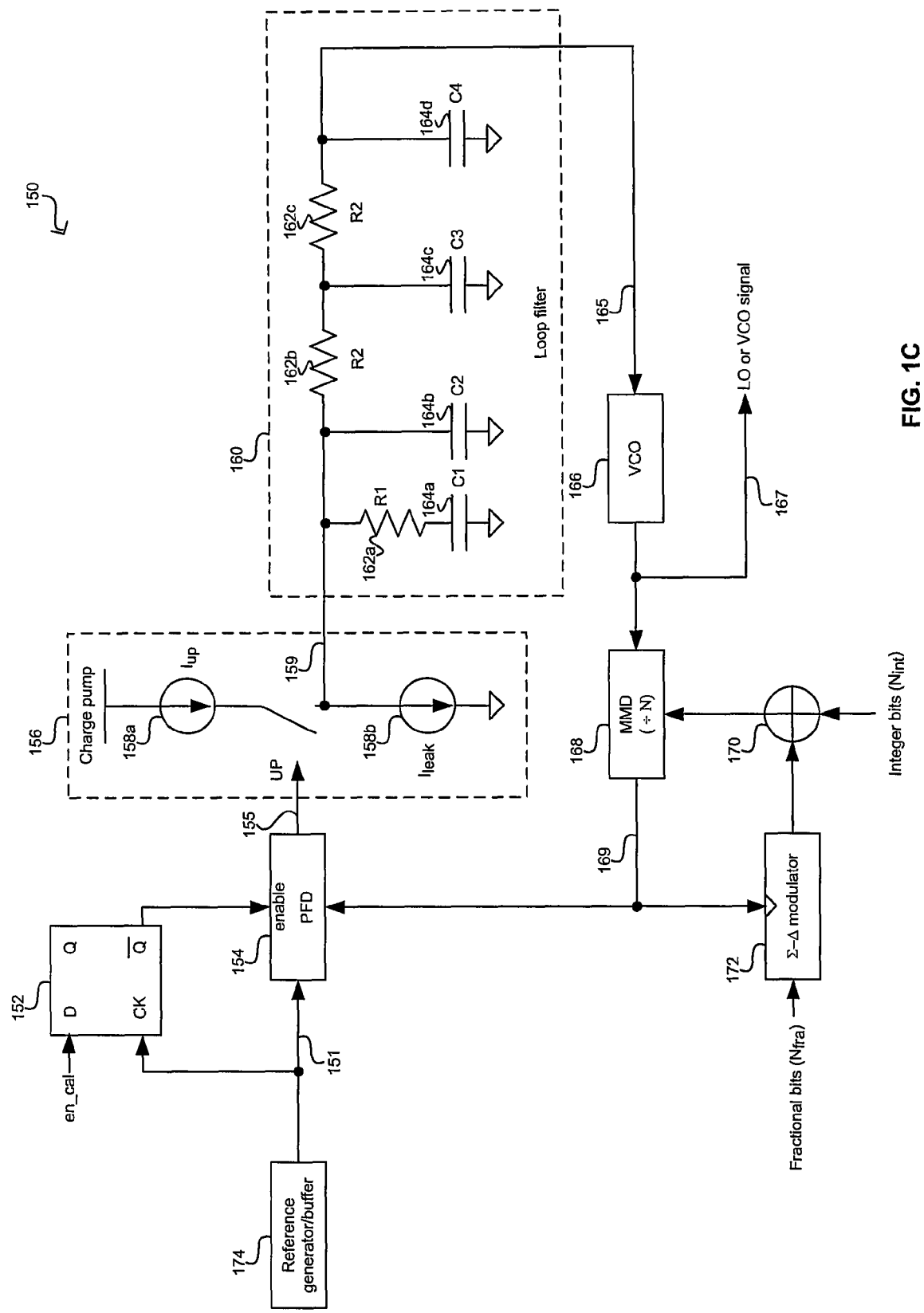
FIG. 1C is a block diagram illustrating an exemplary fractional-N phase-locked-loop (PLL) synthesizer for use in a wireless terminal, in accordance with an embodiment of the invention.

FIG. 1C is a block diagram illustrating an exemplary fractional-N phase-locked-loop (PLL) synthesizer for use in a wireless terminal, in accordance with an embodiment of the invention. Referring to FIG. 1C, there is shown a fractional-N PLL synthesizer 150 that may comprise a D flip-flop 152, a phase-frequency detector (PFD) 154, a charge pump 156, a loop filter 160, a voltage controlled oscillator (VCO) 166, a multi-modulus divider (MMD) 168, an adder 170, a Σ-Δ modulator 172, and a reference generator/buffer 174. The fractional-N PLL synthesizer 150 may correspond to the frequency synthesizer 133c disclosed in FIG. 1B. In this regard, the fractional-N PLL synthesizer 150 may be implemented on a chip and may be integrated with other components of the RF receiver 130, for example.

In one embodiment of the invention, the reference generator/buffer 174 may be communicatively coupled to an off-chip crystal (Xtal) and may operate as a crystal oscillator. The fractional-N PLL synthesizer 150 may be designed for operation with a plurality of crystal frequencies in order to generate the local oscillator (LO) or output reference signal that corresponds to a specified wireless communication protocol operation. In this regard, the fractional-N PLL synthesizer 150 may enable generation of an appropriate output reference signal from the Xtal oscillator 174 for operating in accordance with WLAN system requirements. When the crystal frequency is low, a narrower loop bandwidth may be selected for the fractional-N PLL synthesizer 150 to at least partially reduce out-of-band quantization noise. When crystal frequency is high, a wider loop bandwidth may be selected to at least partially suppress in-band noise produced by the VCO 166.

In another embodiment of the invention, the fractional-N PLL synthesizer 150 may receive an input reference signal from another portion of the RF receiver 130 or from a portion or component from the wireless terminal 120 disclosed in FIG. 1A. The signal may be buffered by the reference generator/buffer 174. In this regard, the fractional-N PLL synthesizer 150 may generate the LO or output reference signal that corresponds to a specified wireless communication protocol operation from the received input reference signal.

The reference generator/buffer 174 may comprise suitable logic, circuitry, and/or code that may enable buffering a received input reference signal. The reference generator/buffer 174 may also enable operation as a crystal oscillator when communicatively coupled to an off-chip crystal. The original frequency of the signal buffered by the reference generator/buffer 174 or the signal generated by the reference generator/buffer 174 operating as a crystal oscillator may be increased by circuitry within the reference generator/buffer 174 that operates as a frequency doubler by generating pulses at both the rising and falling edges of the original reference signal. By doubling the frequency of the signal from the reference generator/buffer 174 to the PFD 154, the PFD 154 may also have to double the phase comparison rate.

The PFD 154 may comprise suitable logic, circuitry, and/or code that may enable controlling the charge pump 156. The PFD 154 may receive an input reference signal, such as the signal 151 from the reference generator/buffer 174, and a divider signal 169 from the MMD 168 in order to generate an UP signal 155 to control the operation of the charge pump 156. The PFD 154 may be enabled by the D flip-flop 152 for general operations and/or during a closed-loop portion of a calibration operation that may be performed on the VCO 166. When the reference generator/buffer 174 utilizes the frequency doubling operation, the PFD 154 may compare the phase at both the rising and falling edges of the original reference signal or original reference clock. This approach may enable improvements to in-band phase noise, by enabling a lower divider ratio, for example, and also to out-of-band noise, by enabling pushing out quantization noise, for example. The improvement may be greater in instances when the reference signal frequency is low.

The charge pump 156 may comprise suitable logic, circuitry, and/or code that may enable generating an output signal 159 that may be utilized for controlling the operation of the VCO 166. The charge pump 156 may comprise a charge up portion 158*a* and a charge down portion 158*b*. The UP signal 155 generated by the PFD 154 may be utilized to enable charging up the output signal 159. The charge up portion 158*a* may correspond to a one side current (Iup), which may be directed by UP signal 155 to charge up the voltage that corresponds to the output signal 159. The charge up portion 158*a* may be programmable by, for example, the processor 125 and/or the digital baseband processor 129 disclosed in FIG. 1A in accordance with crystal and VCO frequencies to optimize loop characteristics. The charge down portion 158*b* may correspond to a constant leakage current that creates a phase offset and enables charging down a voltage that corresponds to the output signal 159. As a result, when the fractional-N PLL synthesizer 150 locks in, the phase error may be away from the zero crossing point, which may lead to a better charge pump linearity. A more linear charge pump may reduce quantization noise folding and lower close-in fractional spur, for example. The charge down portion 158*b* may be programmable by, for example, the processor 125 and/or the digital baseband processor 129 disclosed in FIG. 1A, in accordance with the charge up portion 158*a*.

The loop filter 160 may comprise suitable logic, circuitry, and/or code that may enable filtering the output signal 159 generated by the charge pump 156 to produce a filtered signal 165 that may be utilized for controlling the operation of the VCO 166. In one embodiment of the invention, the loop filter 160 may comprise resistors R1 162*a*, R2 162*b*, and R3 162*c*, and capacitors C1 164*a*, C2 164*b*, C3 164*c*, and C4 164*d*. The components of the loop filter 160 may be programmable by, for example, the processor 125 and/or the digital baseband processor 129 disclosed in FIG. 1A, in accordance with crystal and VCO frequencies to optimize loop characteristics. Notwithstanding the exemplary embodiment disclosed in FIG. 1C, other loop filter designs may be utilized for the loop filter 160.

The VCO 166 may comprise suitable logic, circuitry, and/or code that may enable generation of a local oscillator or output reference signal 167 based on the filtered signal 165 that results by filtering in the loop filter 160 the output signal 159 generated by the charge pump 156. The VCO 166 may utilize a programmable conversion factor ($K_{VCO}$) for determining the output reference signal frequency in accordance with the voltage level of the filtered signal 165. In this regard, the $K_{VCO}$ may be programmable in accordance with the frequency of the VCO 166.

The MMD 168 may comprise suitable logic, circuitry, and/or code that may enable dividing the frequency of the output reference signal 167 generated by the VCO 166 to generate the divider signal 169. The MMD 168 may receive an integer divider number from the addition performed by the adder 170 of the integer bits (Nint) and the output of the $\Sigma$-$\Delta$ modulator 172. In this regard, the fractional divider ratio N is generated by dithering between a plurality of integer values in accordance with the output of the $\Sigma$-$\Delta$ modulator 172. The MMD 168 may utilize true single phase clock (TSPC) logic in at least the high-speed portions of the design to enable the MMD 168 to run at full VCO speed to keep quantization noise from $\Sigma$-$\Delta$ modulator 172 at a minimum and to enable the charge pump 156 to have better linearity. The use of TSPC logic may also provide power savings when compared to conventional high-speed logics such as source-coupled logic (SCL) and current mode logic (CML), for example. Moreover, the MMD 168 may re-synchronize the divider signal 169 with the output reference signal 167 generated by the VCO 166. Re-synchronization may reduce phase noise generated by the MMD 168 and may also enable reduction in quantization noise folding and in close-in fractional spur.

The $\Sigma$-$\Delta$ modulator 172 may comprise suitable logic, circuitry, and/or code that may enable generating a signal to be added to integer bits (Nint) of the fractional divider ratio N based on fractional bits (Nfra) of the fractional divider ratio N. The clock that drives the Σ-Δ modulator 172 may be derived from the divider signal 169 generated by the MMD 168. In this regard, the fractional divider ratio N may be obtained from the following expression: $N=f_{VCO}/f_{REF}$, where $f_{VCO}$ is the frequency of the LO or output reference signal 167 and $f_{REF}$ is the frequency of the input reference signal 151. The integer portion of N is represented by the integer bits $N_{int}$ while the fractional portion of N represented by the fractional bits $N_{fra}$. The output of the Σ-Δ modulator 172 is a stream of integer values that when added to $N_{int}$ produce an average value that approximates the fractional divider ratio N.

Figure 2:
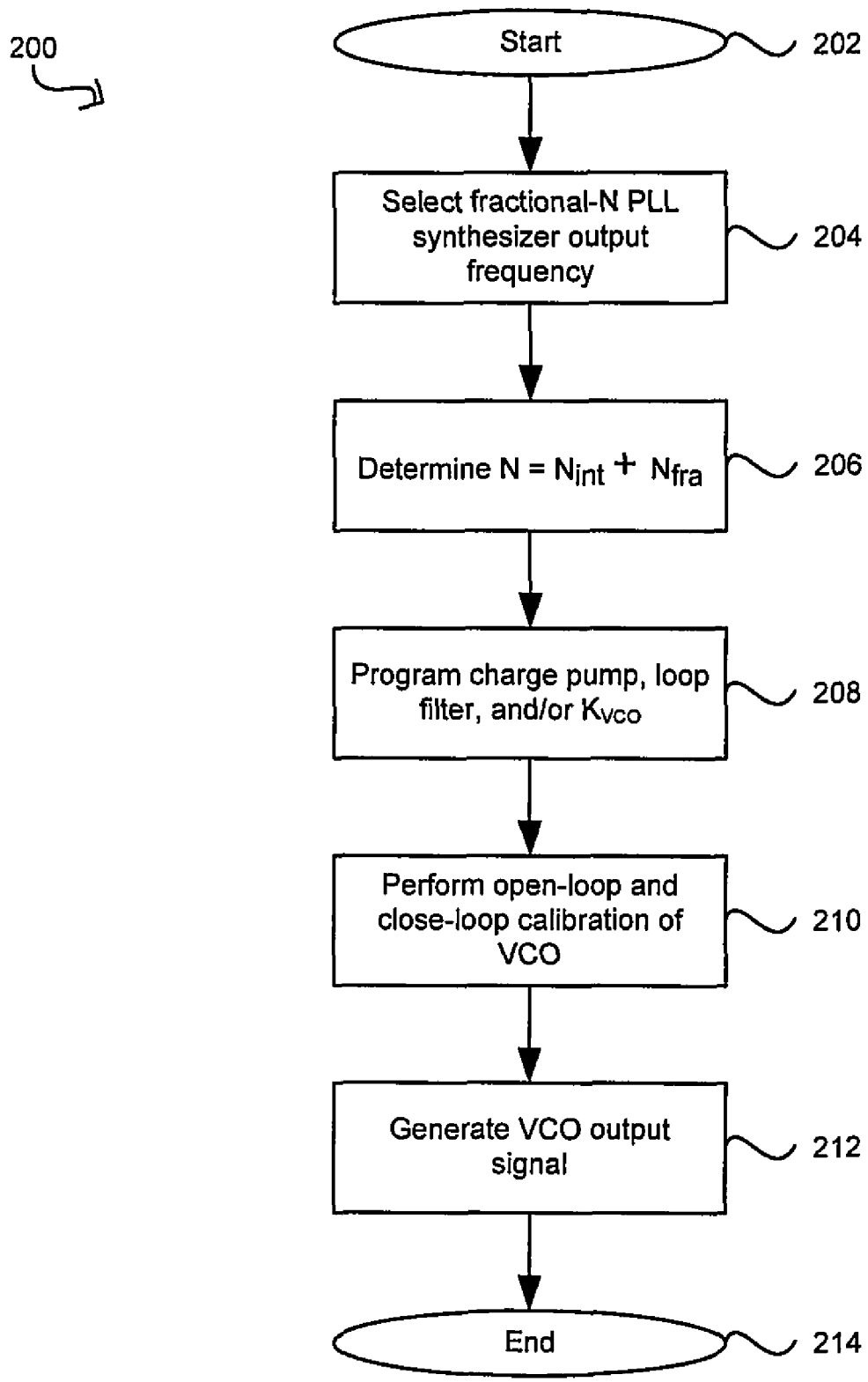
FIG. 2 is a flow diagram illustrating exemplary steps in the operation of a fractional-N PLL synthesizer, in accordance with an embodiment of the invention.

FIG. 2 is a flow diagram illustrating exemplary steps in the operation of a fractional-N PLL synthesizer, in accordance with an embodiment of the invention. Referring to FIG. 2, there is shown a flow diagram 200. In step 204, after start step 202, the output reference signal frequency, $f_{VCO}$, for the fractional-N PLL synthesizer 150 may be selected in accordance with the frequency band of the RF signals received by, for example, the RF receiver 130 disclosed in FIG. 1B. In this regard, the frequency band may depend on the wireless communication protocol being utilized.

In step 206, the fractional divider ratio N may be determined based on the output reference signal frequency, $f_{VCO}$, and the frequency of the input reference signal, $f_{REF}$. The fractional divider ratio N may have an integer portion that is represented by the integer bits $N_{int}$ that may be stored in memory, such as the memory 127 disclosed in FIG. 1A, and that may be communicated to the adder 170. The divider ratio N may also have a fractional portion that is represented by the fractional bits $N_{fra}$ that may be stored in memory and that be communicated to the Σ-Δ modulator 172. In this regard, a plurality of values for $N_{int}$ and $N_{fra}$ may be stored in memory to support a wide range of output reference signal and input reference signal frequencies. In step 208, at least a portion of the charge pump 156, the loop filter 160, and/or the VCO 166 may be programmed to optimize the loop characteristics for a particular set of operational conditions.

In step 210, a calibration or tuning of the VCO 166 may be performed. In this regard, the tuning of the VCO 166 may comprise a coarse tuning operation that may be carried out by utilizing a plurality of switching capacitors and a fine tuning operation that may be carried out by utilizing a plurality of varactors. The coarse tuning may be performed by utilizing an open-loop calibration where the loop filter 160 is disconnected from the VCO 166. The fine tuning may be performed during a closed-loop settling where the loop filter 160 is connected to the VCO 166. Long settling time that may arise in going from an open-loop calibration operation to a closed-loop operation that may be caused by replacing a large down current with a small leakage current in the charge pump 156 may be addressed by properly enabling and/or disabling the PFD 154 via the D flip-flop 152. In step 212, the fractional-N PLL synthesizer 150 may generate a LO or output reference signal from the VCO 166 in accordance with the wireless communication protocol being utilized. After step 212, the process may proceed to end step 214.

Figure 3:
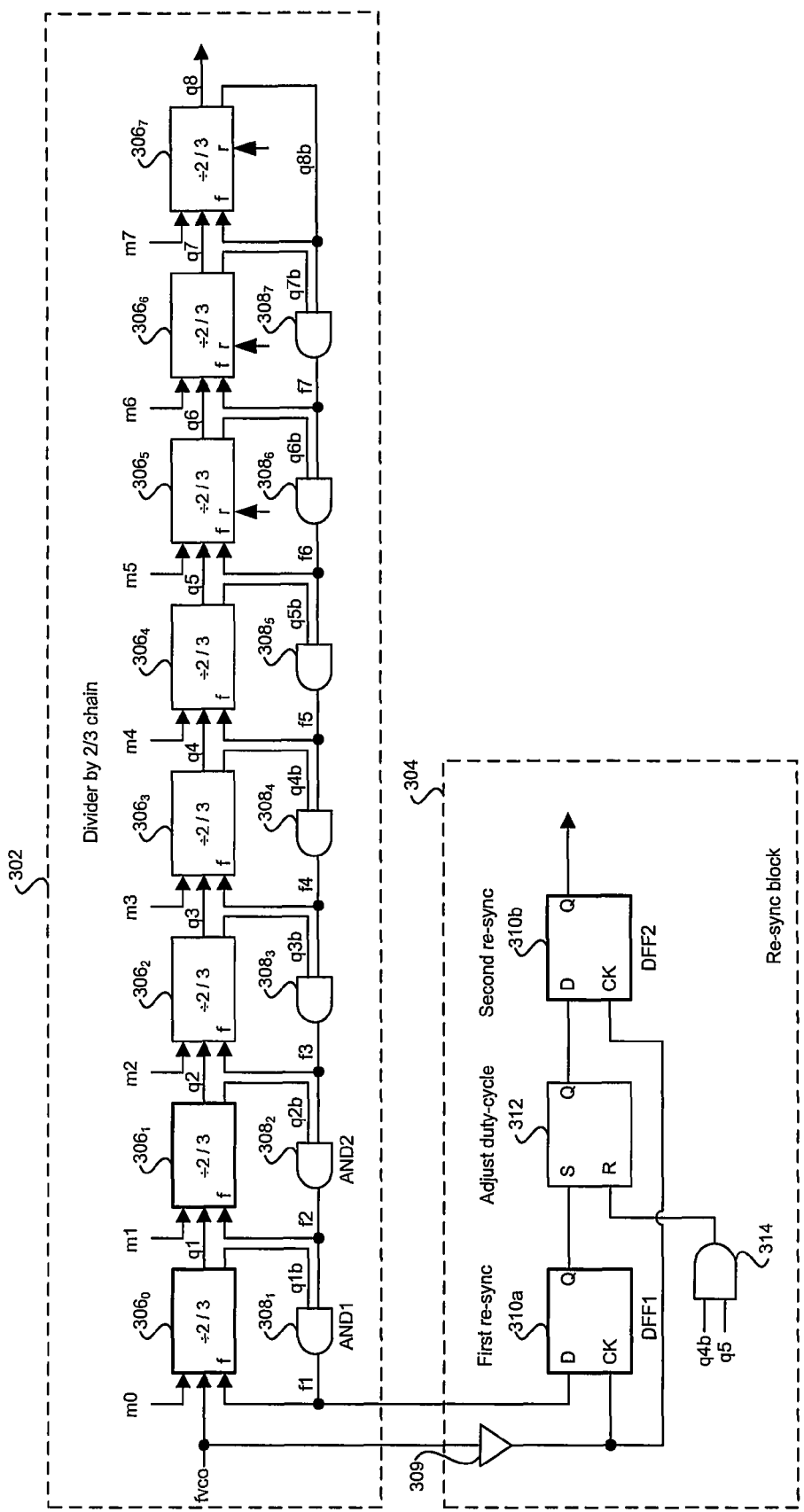
FIG. 3 is a block diagram illustrating an exemplary multi-modulus divider, in accordance with an embodiment of the invention.

FIG. 3 is a block diagram illustrating an exemplary multi-modulus divider, in accordance with an embodiment of the invention. Referring to FIG. 3, there is shown at least a portion of the MMD 168 disclosed in FIG. 1C. The MMD 168 may comprise a divider by 2/3 chain 302 and a re-synchronization (re-sync) block 304. The divider by 2/3 chain 302 may comprise a plurality of divider stages $306_0, \ldots, 306_7$, and a plurality of AND gates $308_1, \ldots, 308_7$. The re-sync block 304 may comprise a first D flip-flop (DFF1) 310a, a second D flip-flop (DFF2) 310b, an RS flip-flop 312, an AND gate 314, and a delay 309.

The divider by 2/3 chain 302 may comprise suitable logic, circuitry, and/or code that may enable dividing the frequency of the VCO signal 167 ($f_{VCO}$) in accordance with the number of divider stages enabled for operation to generate the divider signal 169. Each of the divider stages $306_0, \ldots, 306_7$ may comprise suitable logic and/or circuitry that may enable dividing an input signal frequency by a factor of 2 or by a factor of 3. In this regard, the modulus signals m0, ..., m7 may be utilized to control whether a division by 2 or 3 may occur in the corresponding divider stage. Moreover, the gating signals f1, ..., f7, and q8b may be utilized to ensure that the division by 3 only happens maximally once within one whole divide cycle, for example. The divider stages $306_0, \ldots, 306_7$ may generate output signals q1, ..., q8 and q1b, ..., q8b respectively. The signals q1, ..., q8 may be used as a clock signal for the following stage. The signals q1b, ..., q8b may be fed back to the AND gates $308_1, \ldots, 308_7$.

In some instances, fewer than the total number of divider stages $308_0, \ldots, 306_7$ may be sufficient for achieving a specified divider ratio and the remaining divider stages may be disabled by, for example, a reset signal. FIG. 3 shows the last three divider stages $306_5, 306_6,$ and $306_7$ comprising a reset signal input to disable their operation when necessary. Notwithstanding the divider by 2/3 chain disclosed in FIG. 3, aspects of the invention need not be so limited and a different number of divider stages may be utilized and a different number of divider stages may comprise a reset signal input.

The AND gates $308_1, \ldots, 308_7$ may comprise suitable logic and/or circuitry that may enable generation of the gating signals f1, ..., f7. The AND gate $308_1$ may be referred to as AND1 and the AND gate $308_2$ may be referred to as AND2, for example. In this regard, the AND gates $308_1, \ldots, 308_7$ may receive as inputs the output signals q1b, ..., q8b and the output of a preceding AND gate. For example, the first AND gate $308_1$ may generate the gating signal f1 based on q1b and the gating signal f2 which is the output of the second AND gate $308_2$.

In order to increase the operating speed and reduce power consumption of the divider by 2/3 chain 302, at least a portion of the divider stages $306_0, \ldots, 306_7$ may be implemented by using TSPC logic. In an exemplary embodiment of the invention, the first and second divider stages $306_0$ and $306_1$ may be implemented using TSPC logic. The first divider stage $306_0$ may operate at substantially the same frequency as the frequency of the VCO signal 167 ($f_{VCO}$) and the second divider stage 3061 may operate at approximately half the frequency of the first divider stage $306_0$. Additional divider stages may also be implemented based on TSPC logic. However, the TSPC logic may be a dynamic logic and may require a minimum frequency of operation to work effectively. In this regard, the TSPC logic may be utilized in a plurality of divider stages down the divider by 2/3 chain 302 that operate at or higher than a minimum frequency required by the TSPC logic to work effectively.

The re-sync block 304 may comprise suitable logic, circuitry, and/or code that may enable re-synchronization of the divider signal 169 with the VCO signal 167. The DFF1 310a may comprise suitable logic and/or circuitry that may enable performing a first re-synchronization operation. The delay 309 may comprise suitable logic and/or circuitry that may enable a delay to the signal from the VCO 166 to compensate for the delay in generating the signal f1 at the output of the AND gate $308_1$. The DFF1 310b may comprise suitable logic and/or circuitry that may enable performing a second re-synchronization operation. The SR flip-flop 312 may comprise suitable logic and/or circuitry that may enable adjusting the duty cycle of the divider signal 169 based on the first re-synchronization operation and gating signals, such as signals q4b and q5 that may be utilized as inputs to the AND gate 314. In this regard, signals q4b and q5 may be utilized for controlling the duty cycle adjustment since the divider stages that follow the generation of signals q4b and q5, that is, divider stages $306_5$, $306_6$, and $306_7$ may be disabled by a reset signal.

Figure 4:
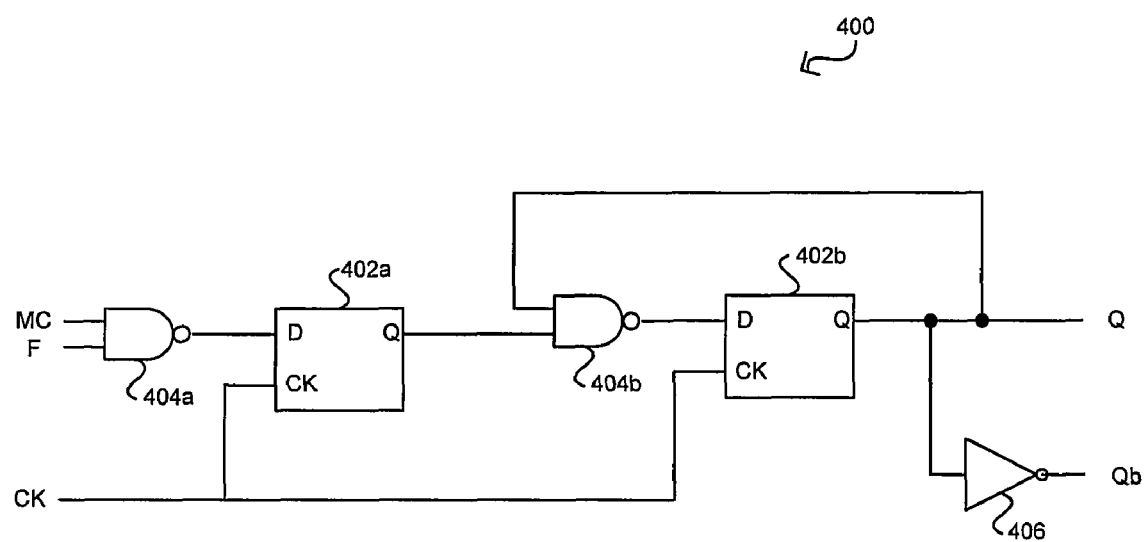
FIG. 4 is a block diagram illustrating an exemplary divider stage, in accordance with an embodiment of the invention.

FIG. 4 is a block diagram illustrating an exemplary divider stage, in accordance with an embodiment of the invention. Referring to FIG. 4, there is shown a divider stage 400 that may comprise a first D flip-flop 402a, a second D flip-flop 402b, a first two-input NAND gate 404a, a second two-input NAND gate 404b, and an inverter 406. The MC and F signal inputs to the first two-input NAND gate 404a may correspond to the gating signals utilized for controlling whether the divider stage 400 is to perform a divide by 2 or divider by 3 operation as disclosed in FIG. 3. For example, MC may be the modulus signal and F may be the divide by 3 gating control signal. In this regard, when MC=0 or F=0, the divider stage 400 may divide by 2. When MC=1 and F=1, the divider stage 400 may divide by 3.

The clock signal, CK, may correspond to the input signal to the divider stage. For example, for the first divider stage $306_0$ in FIG. 3, the clock signal may correspond to the VCO signal 167. In another example, for the second divider stage $306_1$ in FIG. 3, the clock signal may correspond to the output signal q1 generated by the first divider stage $306_0$. The output, Q, from the second D flip-flop 402b may correspond to the output signal of the divider stage 400 whose frequency may be approximately ½ or ⅓ the frequency of the clock signal, CK. The output, Qb, is the inverted value of Q that results from the use of the inverter 406.

The first D flip-flop 402a and the second D flip-flop 402b may be implemented using TSPC logic or other conventional logic, for example. When implemented using TSPC logic, the divider stage 400 may be enabled to operate at higher frequencies. In this regard, divider stages in the divider by 2/3 chain 302 that operate at higher frequencies may be implemented using TSPC logic, while divider stages that operate a lower frequencies may be implemented using conventional static digital logic, for example.

Figure 5:
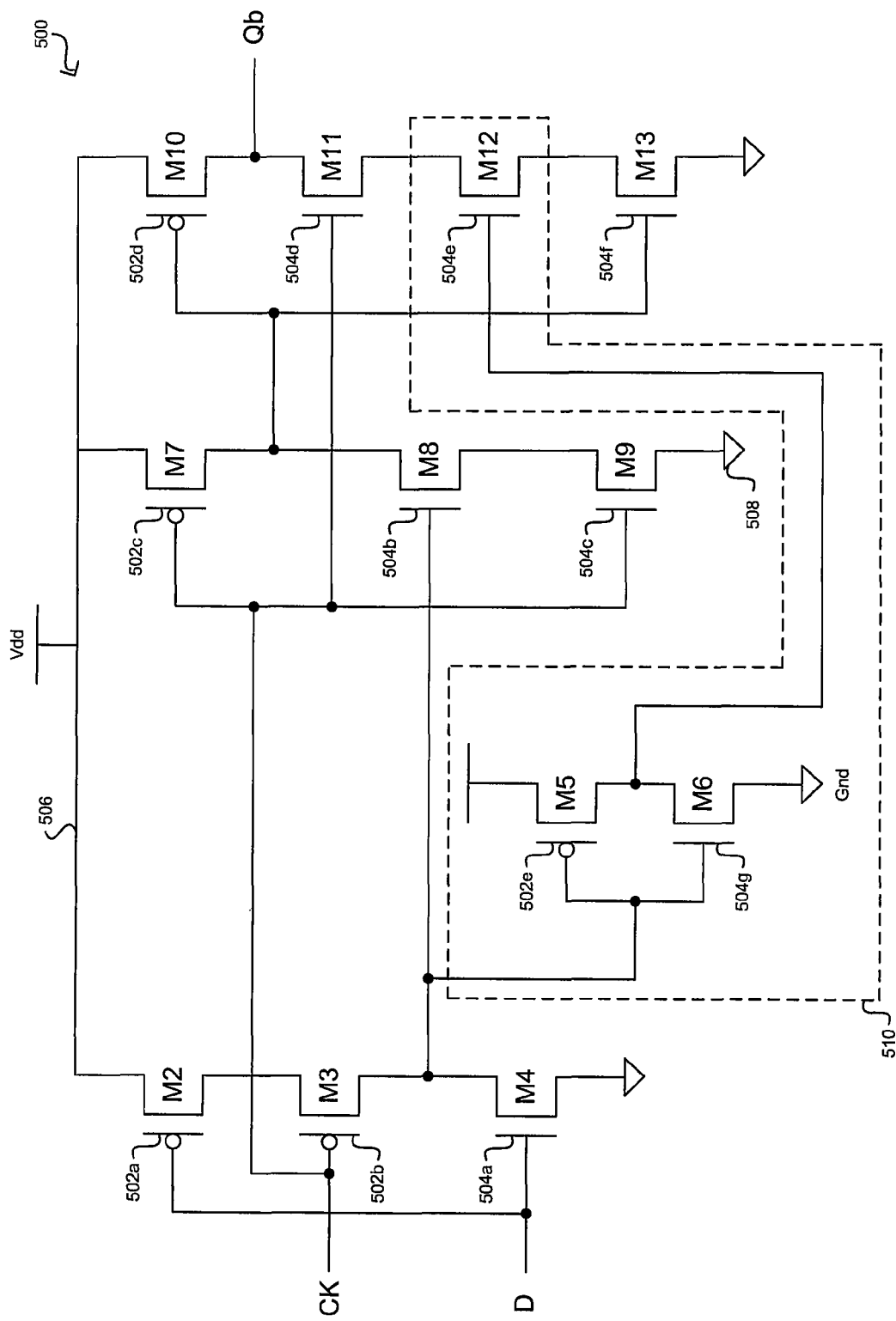
FIG. 5 is a circuit diagram illustrating an exemplary TSPC D flip-flop for use in a divider stage, in accordance with an embodiment of the invention.

FIG. 5 is a circuit diagram illustrating an exemplary TSPC D flip-flop for use in a divider stage, in accordance with an embodiment of the invention. Referring to FIG. 5, there is shown a TSPC D flip-flop 500 that may be utilized in the divider stage 400 disclosed in FIG. 4 to operate at higher frequencies as required to enable the input frequency to the divider by 2/3 chain 302 to be substantially the same as that of the VCO signal 169, for example. In this regard, the TSPC D flip-flop 500 may comprise a plurality of p-type transistors 502a, . . . , 502e, and a plurality of n-type transistors 504a, . . . , 504g. Moreover, the TSPC flip-flop 500 may enable operation between a specified voltage supply (Vdd) 506 and ground (Gnd) 508.

The input signal to the D port of the TSPC D flip-flop 500 may be communicated to the transistors 502a (M2) and 504a (M4). The clock signal, CK, may be communicated to the transistors 502b (M3), 502c (M7), 504c (M9), and 504d (M11). In this regard, the transistor M3 is not directly coupled to Vdd 506 and the transistor M11 is not directly coupled to the Gnd 508. The portion 510 of the TSPC D flip-flop 500 illustrated by the dashed line corresponds to the transistors that enable TSPC operation of the D flip-flip. In this regard, the transistors 502e (M5) and 504g (M6) operate as an inverter whose output may be communicated to the gate of the transistor 504e (M12).

Figure 6:
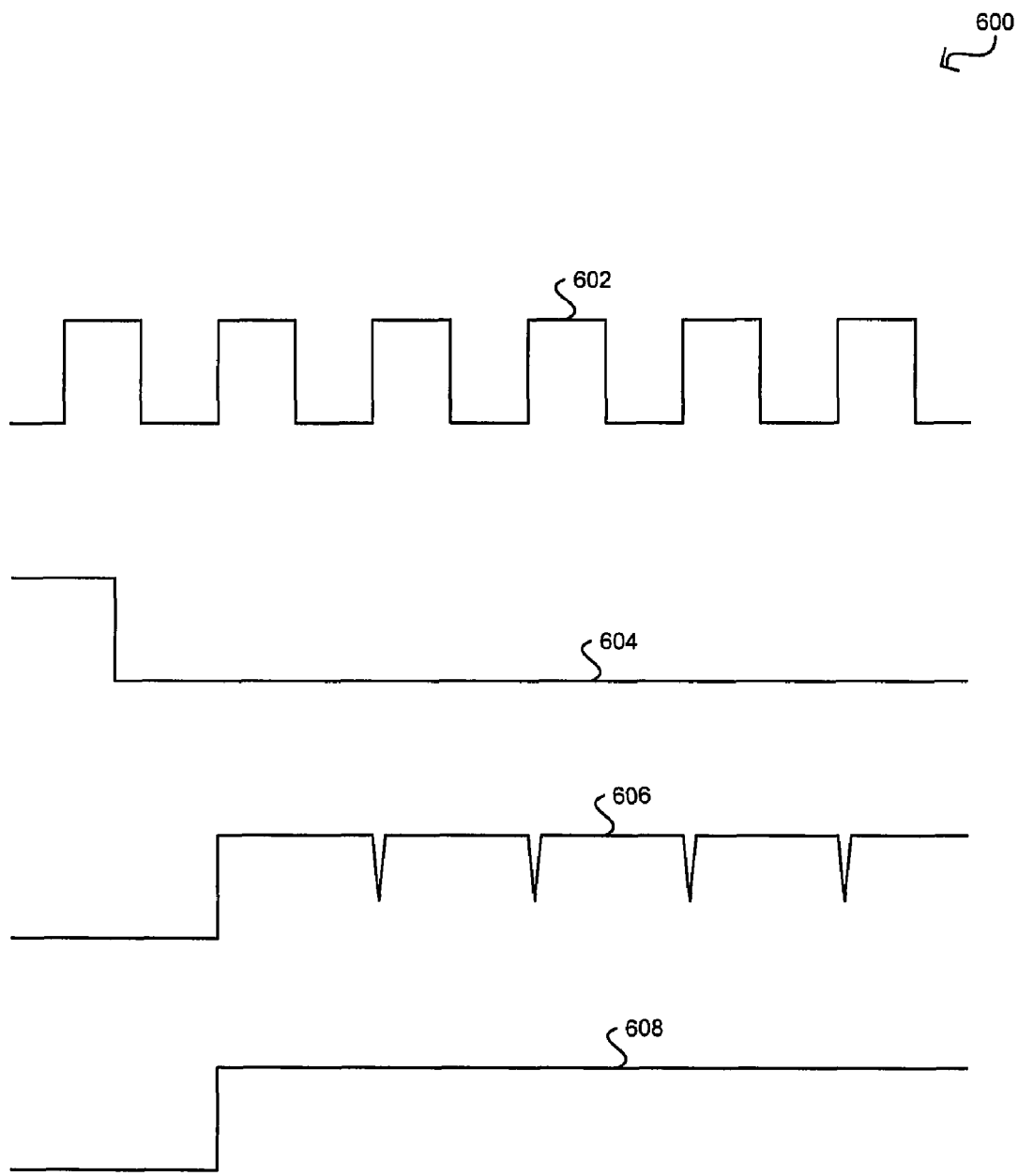
FIG. 6 is a timing diagram illustrating exemplary TSCP D flip-flop waveforms, in accordance with an embodiment of the invention.

FIG. 6 is a timing diagram illustrating exemplary TSCP D flip-flop waveforms, in accordance with an embodiment of the invention. Referring to FIG. 6, there is shown a timing diagram 600 that may illustrate the operation of the TSPC D flip-flop 500 disclosed in FIG. 5. For example, signal 602 may correspond to the clock signal, CK, which is provided to the TSPC D flip-flop 500 while the signal 604 may correspond to the signal provided to the D port of the TSPC D flip-flop 500. The signal 606 may correspond to the output signal Qb of a D flip-flop without the insertion of transistor M12 and without the use of transistors M5 and M6 operating as an inverter. The signal 608 may correspond to a glitch free output Qb of the TSPC D flip-flop 500 that has transistor M12 inserted, and utilizes transistors M5 and M6 operating as an inverter.

Figure 7:
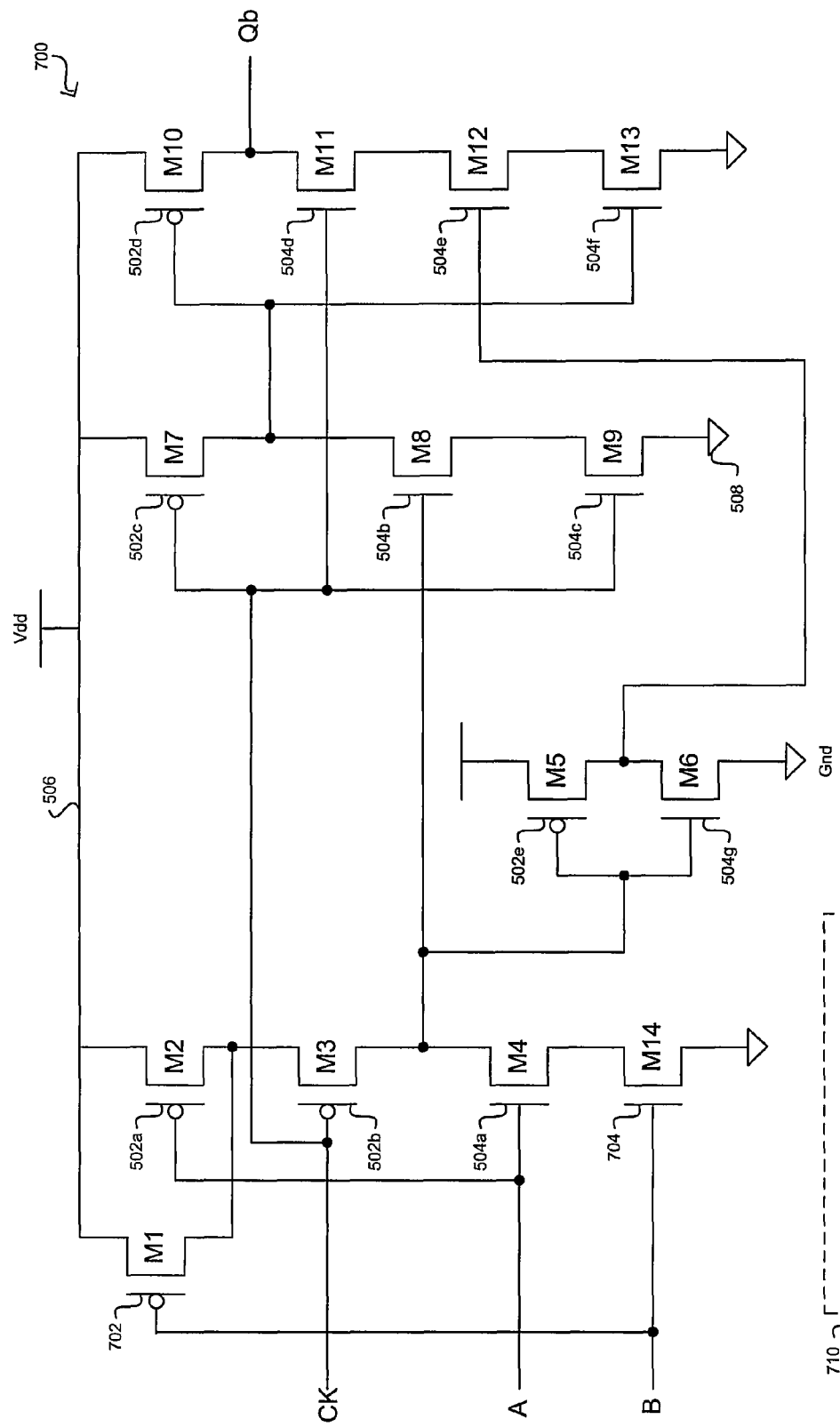
FIG. 7 is a circuit diagram illustrating an exemplary TSPC two-input NAND and D flip-flop for use in the MMD, in accordance with an embodiment of the invention.

FIG. 7 is a circuit diagram illustrating an exemplary TSPC two-input NAND and D flip-flop for use in the MMD, in accordance with an embodiment of the invention. Referring to FIG. 7, there is shown a gate level block 710 comprising a two-input NAND gate 712 and a D flip-flop 714. The divider stage 400 disclosed in FIG. 4 may be implemented more efficiently by utilizing two instances of the gate level blocks 710 instead of four independent gate level components as disclosed in FIG. 4. In this regard, the TSPC D flip-flop 500 disclosed in FIG. 5 may be integrated with a two-input NAND gate to produce the gate level block 710. FIG. 7 also shows a circuit 700 that corresponds to a two-input NAND gate integrated with the TSPC D flip-flop 500. By adding the p-type transistor 702 (M1) and the n-type transistor 704 (M14) to the circuit disclosed in FIG. 5, the gate level block 710 may be implemented using TSPC logic for use in the divider stage 400 when operating a higher frequencies. This approach may improve the speed of operation by combining the NAND gate with the D flip-flop and subsequently removing the delay associated with a stand-alone NAND gate.

Figure 8:
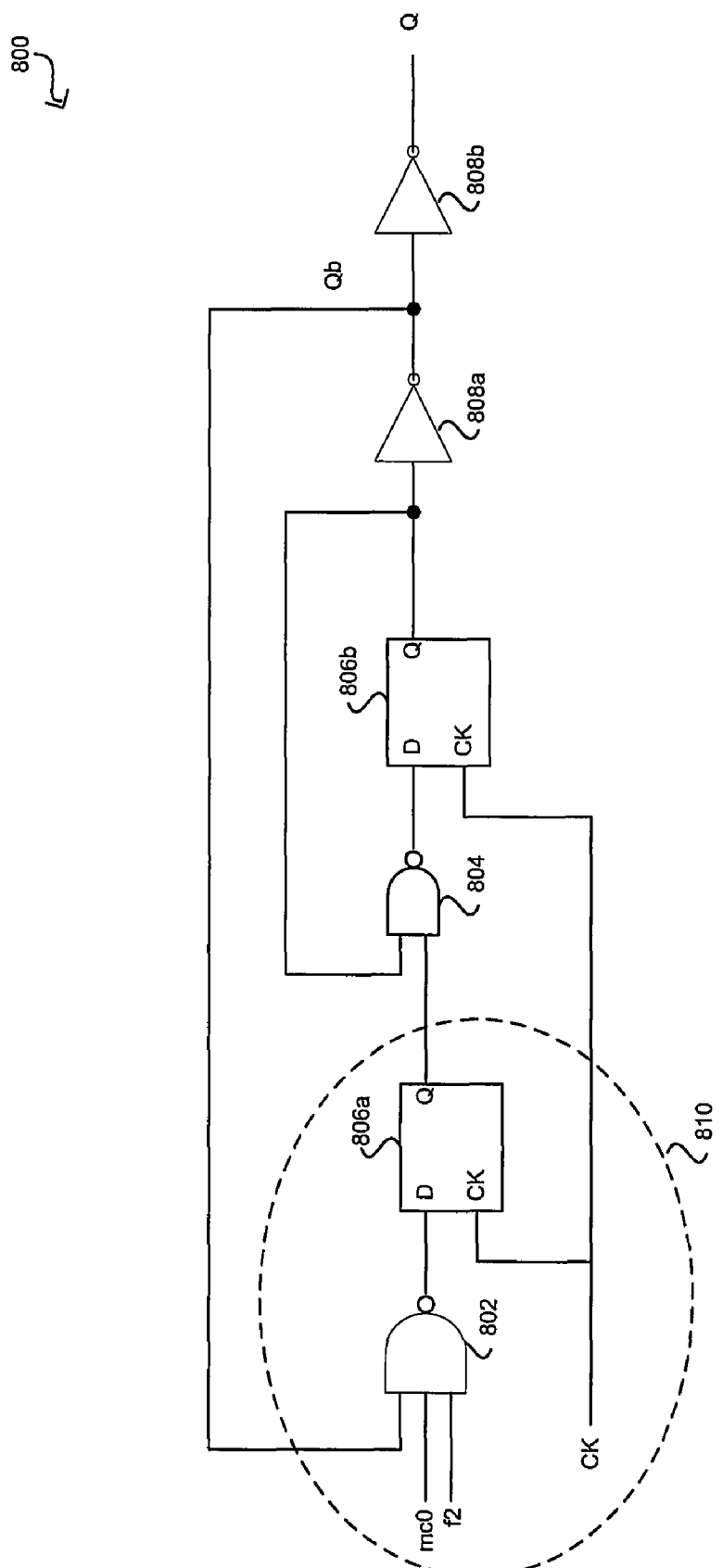
FIG. 8 is a block diagram illustrating an exemplary first divider stage within the divider by 2/3 chain, in accordance with an embodiment of the invention.

FIG. 8 is a block diagram illustrating an exemplary first divider stage within the divider by 2/3 chain, in accordance with an embodiment of the invention. Referring to FIG. 8, there is shown a first divider stage 800, such as the divider stage $306_0$, for the divider by 2/3 chain 302 disclosed in FIG. 3. The first divider stage 800 may result in a more efficient implementation of the operations provided by the divider stage $306_0$ and the two-input AND gate $308_1$ (AND1). The first divider stage 800 may comprise a three-input NAND gate 802, a first D flip-flop 806a, a second D flip-flop 806b, a two-input NAND gate 804, a first inverter 808a, and a second inverter 808b. The first and second D flip-flops 806a and 806b be may be implemented by utilizing the exemplary TSPC D flip-flop 500 disclosed in FIG. 5. Moreover, the three-input NAND gate 802 may result from combining the operations of the two-input NAND gate 404a disclosed in FIG. 4 and the operations of AND1 in FIG. 3. Additional implementation efficiency may result by combining the operations illustrated by the portion 810 inside the dashed line. In this regard, the portion 810 may comprise the three-input NAND gate 802 and the D flip-flop 806a, which may be implemented using the TSPC D flip-flop 500.

Figure 9:
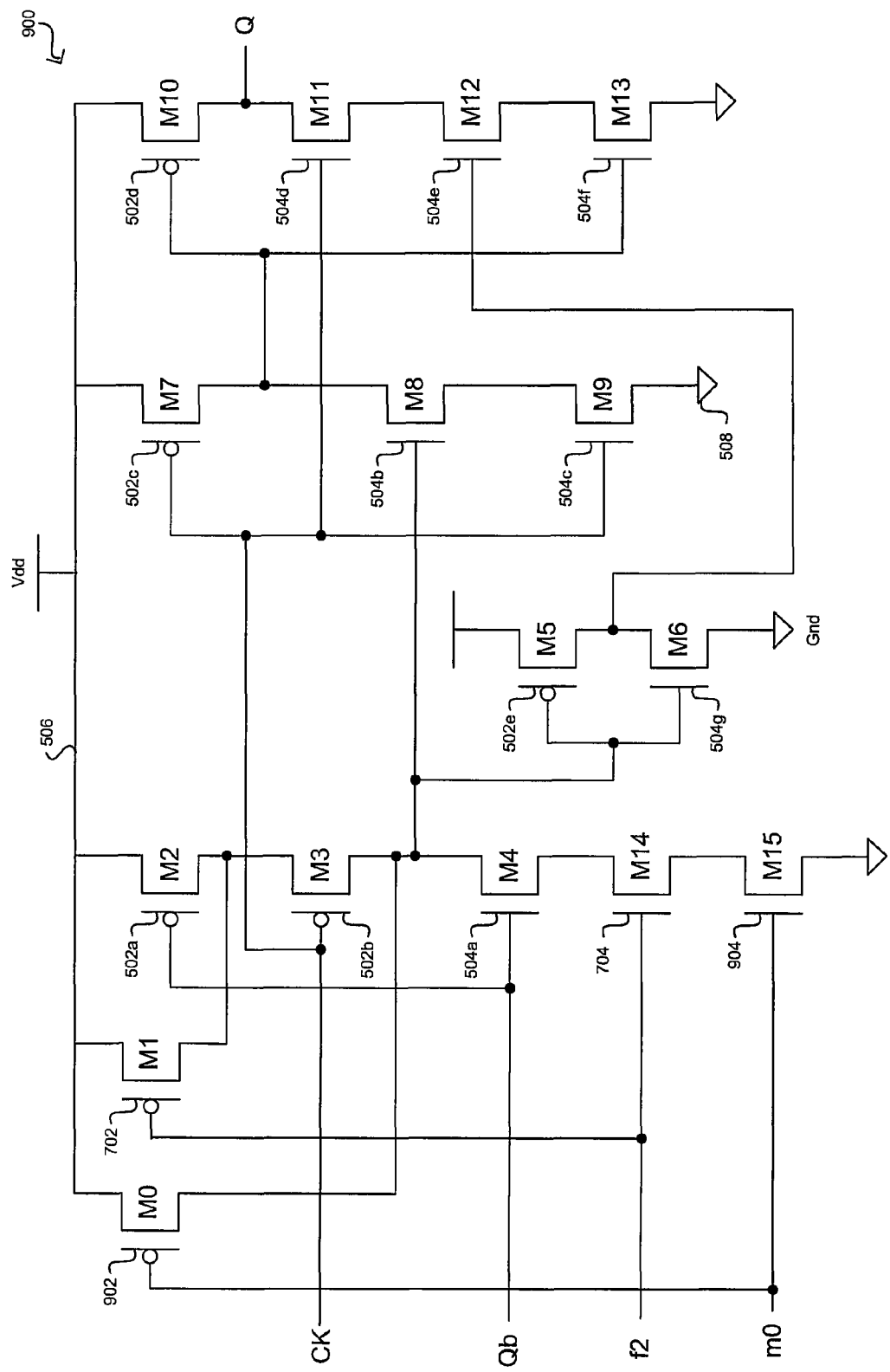
FIG. 9 is a circuit diagram illustrating an exemplary combination of a three-input NAND and a TSPC D flip-flop for use in a first divider stage, in accordance with an embodiment of the invention.

FIG. 9 is a circuit diagram illustrating an exemplary combination of a three-input NAND and a TSPC D flip-flop for use in a first divider stage, in accordance with an embodiment of the invention. Referring to FIG. 9, there is shown a circuit 900 that corresponds to the portion 810 of the first divider stage 800 in FIG. 8 comprising the three-input NAND gate 802 integrated with the TSPC D flip-flop 500. By adding the p-type transistors 702 (M1) and 902 (M0) and the n-type transistors 704 (M14) and 904 (M15) to the circuit disclosed in FIG. 5, the portion 810 of the first divider stage 800 may be implemented using TSPC logic to enable the first divider stage 800 to operate at substantially the same frequency as that of the VCO signal 167. This approach may improve the speed of operation by combining AND1 in FIG. 3 and the NAND gate 404a in FIG. 4 with a D flip-flop, and subsequently removing the delay associated with a stand-alone AND gate and a stand-alone NAND gate.

In addition to utilizing the TSPC D flip-flop 500 in the divider stages of the divider by 2/3 chain 302 in the MMD 168, the TSPC D flip-flop 500 may also be utilized when implementing the DFF1 and DFF2 in the re-synchronization block 304 in the MMD 168.

Figure 10:
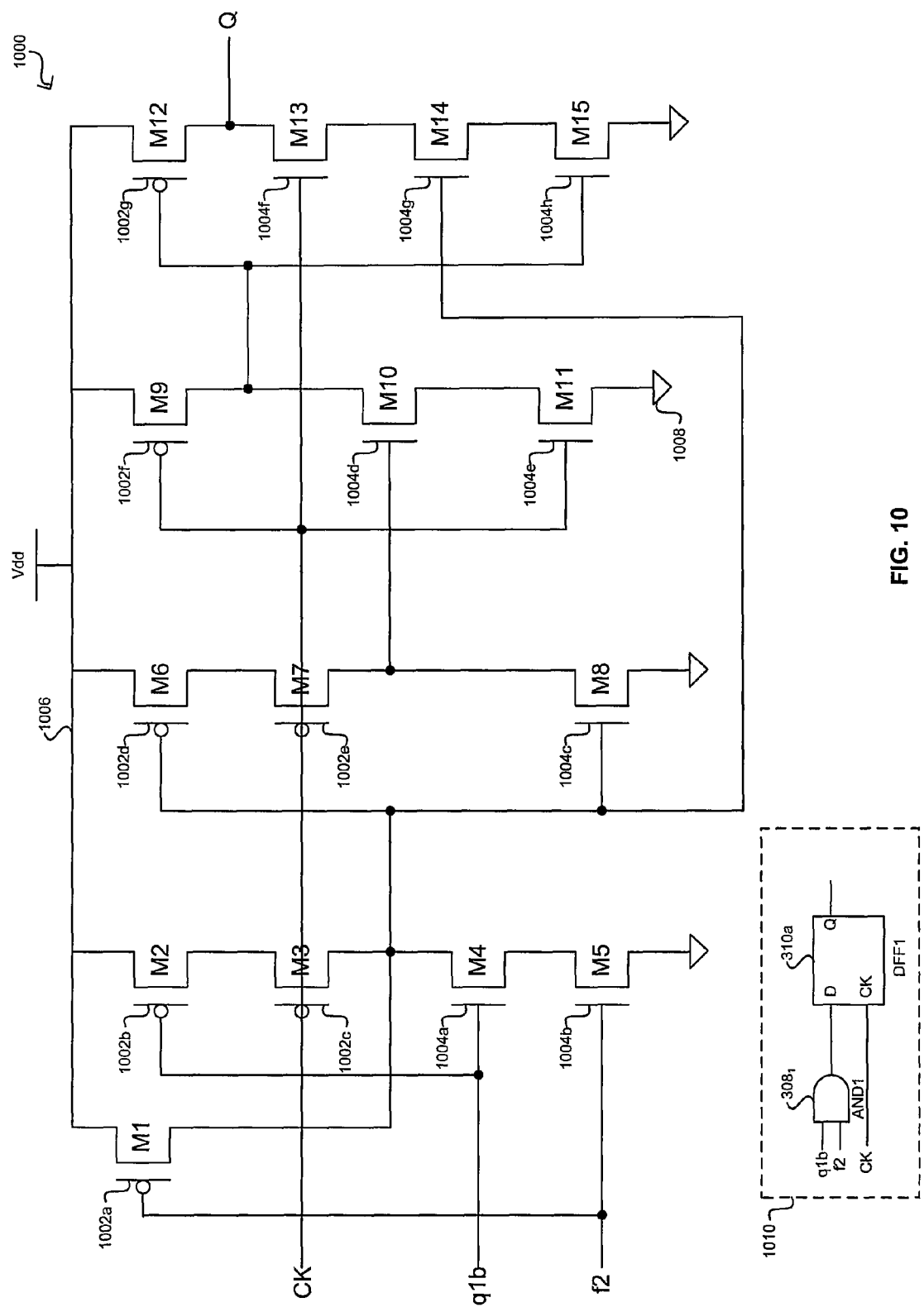
FIG. 10 is a block diagram illustrating an exemplary portion of the re-synchronization block that utilizes TSPC logic, in accordance with an embodiment of the invention.

FIG. 10 is a block diagram illustrating an exemplary portion of the re-synchronization block that utilizes TSPC logic, in accordance with an embodiment of the invention. Referring to FIG. 10, there is shown a gate level block 1010 comprising the two-input AND gate $308_1$ (AND1) and the D flip-flop 310a (DFF1). The operations of the re-sync block 304 may be implemented more efficiently by combining the operations of the AND1 gate and the DFF1 as shown in the gate level block 1010. In this regard, a modification of the TSPC D flip-flop 500 disclosed in FIG. 5 may be integrated with the AND1 gate to produce the gate level block 1010. FIG. 10 also shows a circuit 1000 that corresponds to a two-input AND gate integrated with the modified TSPC D flip-flop 500. The circuit 1000 may comprise a plurality of p-type transistors 1002a, . . . , 1002g, and a plurality of n-type transistors 1004a, . . . , 1004h. Moreover, the circuit 1000 may enable operation between a specified voltage supply (Vdd) 1006 and ground (Gnd) 1008. However, the circuit 1000 need not utilize an inverter as disclosed for the portion 510 in the TSPC D flip-flop 500 FIG. 5.

The approach and design described above may enable the implementation of a fractional-N PLL frequency synthesizer that may provide reduced power requirements, improved noise performance, and/or higher operating bandwidth to enable the operation of wireless terminals that may support, for example, advanced WLAN system requirements.

Accordingly, the present invention may be realized in hardware, software, or a combination of hardware and software. The present invention may be realized in a centralized fashion in at least one computer system, or in a distributed fashion where different elements are spread across several interconnected computer systems. Any kind of computer system or other apparatus adapted for carrying out the methods described herein is suited. A typical combination of hardware and software may be a general-purpose computer system with a computer program that, when being loaded and executed, controls the computer system such that it carries out the methods described herein.

The present invention may also be embedded in a computer program product, which comprises all the features enabling the implementation of the methods described herein, and which when loaded in a computer system is able to carry out these methods. Computer program in the present context means any expression, in any language, code or notation, of a set of instructions intended to cause a system having an information processing capability to perform a particular function either directly or after either or both of the following: a) conversion to another language, code or notation; b) reproduction in a different material form.

While the present invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

What is claimed is:

1. A method for signal processing, the method comprising:
in a fractional-N phase-locked-loop (PLL) synthesizer that comprises a divider and a VCO, generating a divider signal in said divider from an output reference signal generated from said VCO, wherein said divider comprises at least one divider stage that utilizes true single phase clock (TSPC) logic D flip-flops for dividing said VCO output reference signal, wherein said TSPC logic D flip-flops comprise a NAND gate coupled to a D input of said D flip-flops;
re-synchronizing said VCO output reference signal and said divider signal, wherein said divider comprises at least two re-synchronization stages that utilize a TSPC logic D flip-flop; and
feeding back said generated divider signal within said fractional-N PLL synthesizer to produce said VCO output reference signal.

2. The method according to claim 1, comprising operating a first of said at least one divider stage at substantially the same frequency as that of the VCO output reference signal.

3. The method according to claim 1, comprising disabling at least one of said at least one divider stage.

4. The method according to claim 1, comprising adjusting a duty cycle of said divider signal between a first and a second of said at least two re-synchronization stages.

5. A system for signal processing, the system comprising:
a fractional-N phase-locked-loop (PLL) synthesizer that comprises a divider and a VCO;
said divider enables generation of a divider signal from an output reference signal generated from said VCO, wherein said divider comprises at least one divider stage that utilizes true single phase clock (TSPC) logic D flip-flops for dividing said VCO output reference signal, wherein said TSPC logic comprises a NAND gate coupled to a D input of said D flip-flops;
said divider enables re-synchronization of said VCO output reference signal and said divider signal, wherein said divider comprises at least two re-synchronization stages that utilize a TSPC logic D flip-flop; and
said divider feeds back said generated divider signal within said fractional-N PLL synthesizer to produce said VCO output reference signal.

6. The system according to claim 5, wherein a first of said at least one divider stage in said divider enables operation at substantially the same frequency as that of the VCO output reference signal.

7. The system according to claim 5, wherein said fractional-N PLL synthesizer enables disabling at least one of said at least one divider stage.

8. The system according to claim 5, wherein said divider enables adjustment of a duty cycle of said divider signal between a first and a second of said at least two re-synchronization stages.

9. A system for signal processing, the system comprising:
a D flip-flop integrated within at least one divider stage in a divider utilized by a fractional-N phased-locked-loop (PPL) synthesizer;

said D flip-flop utilizes true single phase clock (TCPC) logic comprising a NAND gate coupled to a D input of said D flip-flop; and said D flip-flop enables communication of a received clock signal to at least a p-type transistor in a first D flip-flop circuit stage and an n-type transistor in a final D flip-flop circuit stage, wherein a source of said p-type transistor is not directly connected to Vdd and a source of said n-type transistor is not directly connected to ground.

10. The system according to claim 9, wherein said NAND gate comprises a two-input NAND gate.

11. The system according to claim 9, wherein said NAND gate comprises a three-input NAND gate.

12. The system according to claim 9, wherein said D flip-flop is integrated within a first of said at least one divider stage.

13. The system according to claim 9, wherein said D flip-flop is integrated within a second of said at least one divider stage.

14. A system for signal processing, the system comprising:
a D flip-flop integrated within at least one re-synchronization stage in a divider utilized by a fractional-N phased-locked-loop (PLL) synthesizer;
said D flip-flop utilizes true single phase clock (TCPC) logic comprising a NAND gate coupled to a D input of said D flip flop; and
said D flip-flop enables communication of a received clock signal to at least a p-type transistor in a first D flip-flop circuit stage and an n-type transistor in a final D flip-flop circuit stage, wherein a source of said p-type transistor is not directly connected to Vdd and a source of said n-type transistor is not directly connected to ground.

15. The system according to claim 14, wherein said D flip-flop is integrated with a two-input AND gate.

16. The system according to claim 14, wherein said D flip-flop is integrated within a first of said at least one re-synchronization stage.

17. The system according to claim 14, wherein said D flip-flop is integrated within a second of said at least one re-synchronization stage.

18. The system according to claim 14, wherein said D flip-flop is integrated with a delay.

* * * * *